United States Patent [19]

Davis et al.

[11] 4,322,812

[45] Mar. 30, 1982

[54] DIGITAL DATA PROCESSOR PROVIDING FOR MONITORING, CHANGING AND LOADING OF RAM INSTRUCTION DATA

[75] Inventors: Sheila G. Davis, Los Angeles; Robert E. Franks, San Gabriel, both of Calif.

[73] Assignee: Burroughs Corporation, Detroit, Mich.

[21] Appl. No.: 85,388

[22] Filed: Oct. 16, 1979

[51] Int. Cl.³ .................... G06F 9/22; G06F 13/06
[52] U.S. Cl. ............................................. 364/900
[58] Field of Search ..... 364/200 M.S. File, 900 M. S. File

[56] References Cited

U.S. PATENT DOCUMENTS

| | | | |
|---|---|---|---|
| 3,374,467 | 3/1968 | Cast et al. | 364/900 |
| 3,742,456 | 6/1973 | McFiggans et al. | 364/200 |
| 4,031,512 | 6/1977 | Faber | 364/200 X |
| 4,099,229 | 7/1978 | Kancier | 364/200 |

Primary Examiner—Harvey E. Springborn

Attorney, Agent, or Firm—Nathan Cass; Kevin R. Peterson; David G. Rasmussen

[57] ABSTRACT

The internal states of one or more micro-code storing RAMs (random access memories) which control program flow in a digital data processor are made accessible for loading, changing or monitoring purposes using variable mode multi-bit shift register storage devices for the input-output register of each RAM. When the contents of a selected location in a RAM is to be monitored, changed or loaded, the data stored in the selected location is read into the RAM's input-output register and the interconnections of the corresponding storage devices are reconfigured to form a serial string along which the bits in the string are shifted to a monitoring unit for monitoring, diagnosing, changing and/or loading purposes and then returned, via the string, to their original locations in the RAM's input-output register. If changes are required, the changed bits returned to the RAM's input-output register are written into the selected location in the RAM before normal operations are resumed.

6 Claims, 6 Drawing Figures

DIGITAL DATA PROCESSOR PROVIDING FOR MONITORING, CHANGING AND LOADING OF RAM INSTRUCTION DATA

CROSS REFERENCE TO RELATED PATENT APPLICATIONS

This patent application contains subject matter relating to our commonly assigned copending patent applications Ser. Nos. 085,200, 085,277, and 085,278, all filed concurrently herewith on Oct. 16, 1979.

BACKGROUND OF THE INVENTION

This invention relates to improved apparatus and methods for providing for the monitoring and diagnosing of digital circuits and memories with minimum burden on the data processing system. This invention also relates to improved apparatus and methods for loading, changing and/or checking program control data (micro-code) for storage in a RAM (random access memory).

SUMMARY OF THE INVENTION

In a particular preferred form of the invention, internal states within a data processing system are made accessible by providing serial monitoring paths or strings between particular selected storing devices which have the capability of operating in either a normal or monitoring mode. When it is desired to monitor the state of one or more of the storing devices on a selected string, the normal operation is interrupted and the storing devices on the selected string are then switched to their monitoring mode. Clocking is then controlled so that the internal states of the internal storing devices on the selected string are propagated, via the string, to a monitoring unit and then returned, again via the string, so that the internal storing devices on the selected string are returned to their original states, following which normal operation may resume. In the event an error is detected by the monitoring unit with respect to the state of one or more internal storing devices on the selected string, an appropriate indication of the error is provided and also, if desired, corrected states may be provided for substitution in the corresponding internal storing devices.

In order to make internal states within a memory (such as a RAM) readily accessible, the memory input-output register is likewise provided using one or more variable mode storage devices which are in turn connected in a respective string. When access to selected memory storage states is desired, the monitoring unit loads the memory address register with a selected address chosen to read out the selected memory storage states into the memory input-output register. The string containing the memory input-output register is then selected and the states thereof serially shifted to the monitoring unit for monitoring purposes. Corrections can be made by returning corrected values, via the string, to the memory input-output register and then writing these corrected values into the memory.

An advantageous feature of the present invention is that where a memory is a RAM which is used to store micro-code (i.e. instruction data), the same string as is used for monitoring may also be used for loading the RAM with new or changed micro-code as well as for checking the accuracy of the micro-code currently contained in the RAM. This feature is of particular value where a modular data processing system is employed with each module containing a RAM whose stored micro-code controls module operation.

The specific nature of the invention as well as other objects, features, advantages and uses thereof will become readily apparent from the following detailed description taken in conjunction with the accompanying drawings.

DETAILED DESCRIPTION

Like characters and numerals refer to like elements and components throughout the figures of the drawings.

Figure 1:
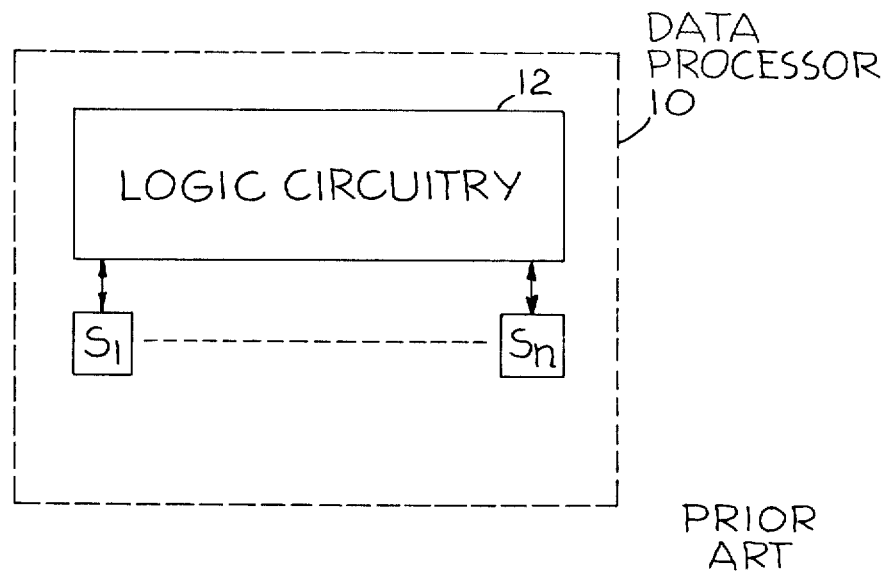
FIG. 1 is a generalized block diagram illustrating how storage devices are typically interconnected by logic circuitry in a conventional data processor.

Referring initially to FIG. 1, a conventional form of data processor 10 is illustrated typically including a plurality of storage devices $S_1-S_n$ cooperating with logic circuitry 12 in providing data processing operations. Other conventional portions of a data processor are not shown in FIG. 1 for the sake of simplicity, but such portions may be considered to operate in cooperation with the storage devices $S_1-S_n$ and logic circuitry 12 in a conventional manner. In the preferred embodiments of the present invention disclosed herein, it is of particular advantage to employ variable mode, multi-bit shift register storage devices such as illustrated by the variable mode, 4-bit shift register 15 illustrated in FIG. 2. Such a shift register 15 may be implemented, for example, using a commercially available Texas Instruments 74S194 integrated circuit chip disclosed in "TTL Data Book for Design Engineers," Texas Instruments Corporation, 2nd Edition, 1976, page 7-316.

Figure 2:
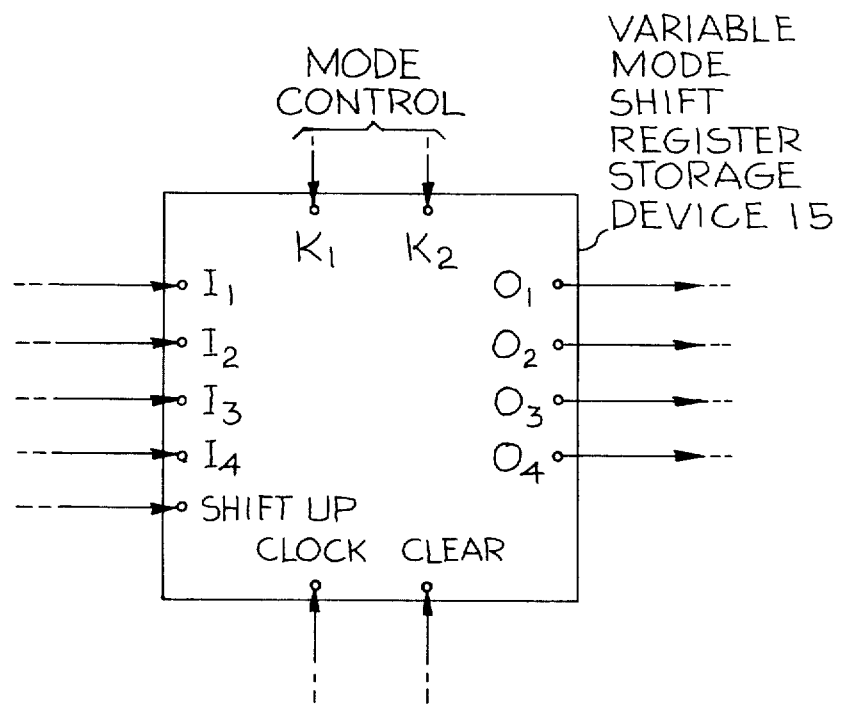
FIG. 2 is a block representation of a variable mode shift register storage device which is preferably employed for providing digital storage in a data processing system incorporating the invention.

As shown in FIG. 2, the 4-bit variable mode shift register 15 includes: inputs $I_1$, $I_2$, $I_3$ and $I_4$; respective outputs $O_1$, $O_2$, $O_3$ and $O_4$; a shift up input for receiving input signals to be shifted through the register; a clear input for use in clearing the shift register to all "0" values; a clock input for receiving a clock signal whose leading edge, for example, is used to initiate shift register operations; and mode control inputs $K_1$ and $K_2$ to which mode control signals are applied for determining the particular mode in which the shift register is to operate. Typically, the mode control signals applied to inputs $K_1$ and $K_2$ may have the following meanings: $K_1K_2 = 00 =$ No Change; $K_1K_2 = 11 =$ Parallel Load; and $K_1K_2 = 01 =$ Shift Up.

It will be understood that when $K_1K_2 = 11 =$ Parallel Load, input binary signals are loaded in parallel into respective inputs $I_1-I_4$ of shift register 15 in response to the leading edge of an applied clock. When so loaded the respective binary values thereof appear at respective outputs $O_1-O_4$. Accordingly, in the Parallel Load mode ($K_1K_2=11$) shift register 15 in FIG. 2 functions as four independent clock-controlled storage devices (similar to flip-flops or latches) having respective inputs $I_1$, $I_2$, $I_3$ and $I_4$ and respective outputs $O_1$, $O_2$, $O_3$ and $O_4$ connected to logic circuitry 12 in FIG. 1 in a customary manner. In the No Change mode ($K_1K_2=00$), the shift register values remain unchanged regardless of the binary signals applied to inputs $I_1-I_4$. In the Shift Up mode ($K_1K_2=01$), serial shifting occurs upwardly in response to each clock—that is, from the shift up input to $I_4$, from $I_4$ to $I_3$, from $I_3$ to $I_2$ and from $I_2$ to $I_1$; and correspondingly from $O_4$ to $O_3$, from $O_3$ to $O_2$ and from $O_2$ to $O_1$. The Parallel Load and No Change modes are used during normal data processing operations, while the Shift Up mode is used during monitoring operations as will hereinafter be described in further detail.

Figure 3:
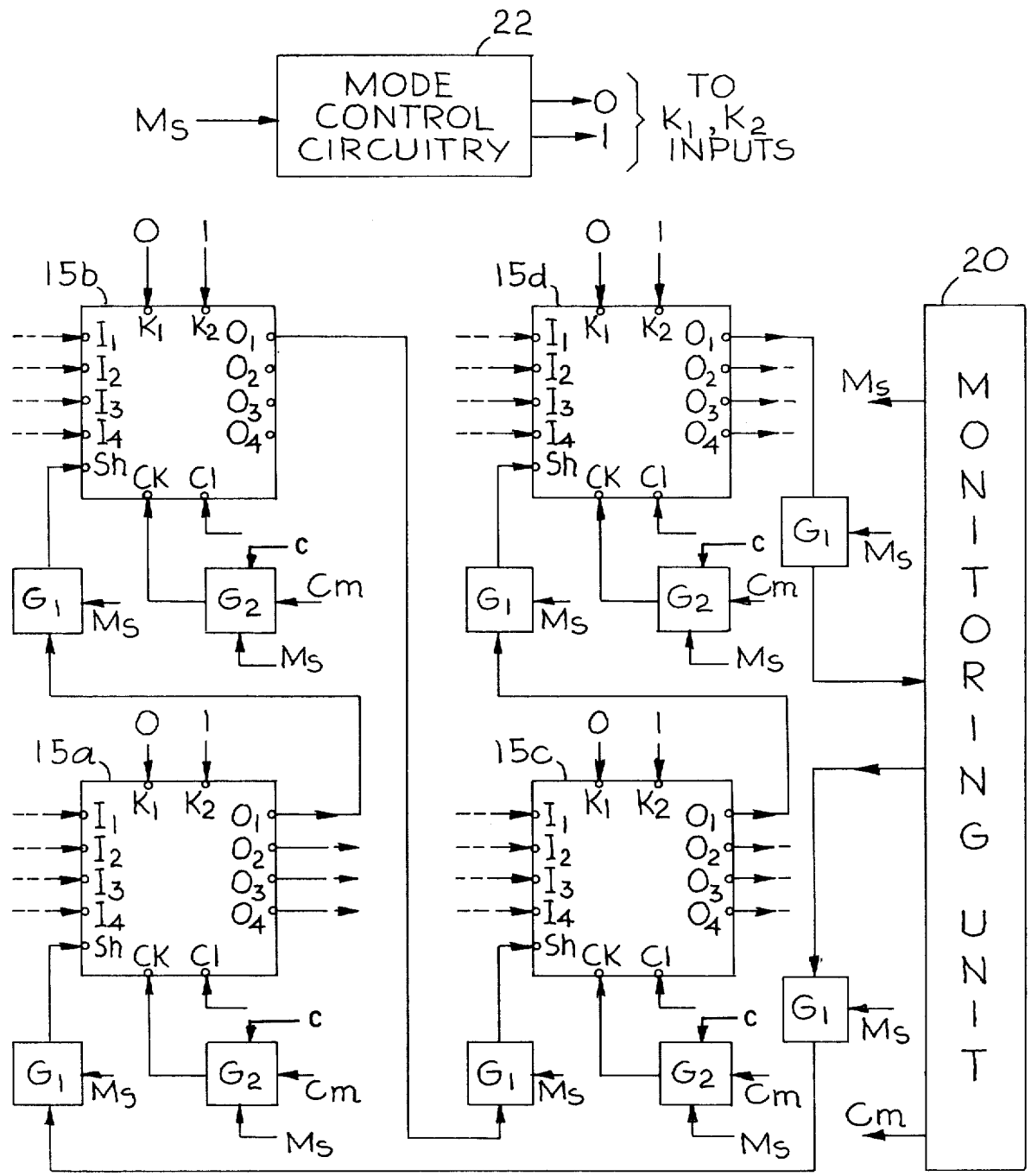
FIG. 3 is a block diagram illustrating how the variable mode shift register storage devices of FIG. 2 may be interconnected in accordance with the invention to form a string for cooperation with a monitoring unit.

FIG. 3 illustrates a preferred embodiment in accordance with the invention for interconnecting variable mode shift register storage devices, such as illustrated in FIG. 2, into a string for cooperation with a monitoring unit 20. Although FIG. 3 illustrates only a single string comprised of four 4-bit variable mode shift register devices 15a-15d, it will be understood that many such strings are ordinarily provided in a data processor, and that more or less shift register storage devices may be provided in each string.

Now considering FIG. 3 in more detail, it will be understood that variable mode storage devices 15a-15d are interconnected by gating circuitry $G_1$ so as to form a string when the gating circuitry $G_1$ is enabled by a monitor enable signal $M_s$ provided by a monitoring unit 20. The monitor enable signal $M_s$ is also used to cause mode control circuitry 22 to provide shift up mode control signals ($K_1K_2=01$) to the mode control inputs $K_1K_2$ of shift register storage devices 15a-15d, thereby causing serial feeding of the respective sixteen states of the four 4-bit shift register storage devices 15a-15d to the monitoring unit 20 and then back again to their respective shift register storage devices 15a-15d under the control of a monitor clock $C_m$ provided by the monitoring unit 20. The monitor clock $C_m$ is applied to the clock input of each of shift register devices 15a-15d via gate circuitry $G_2$ which in response to monitoring control signal $M_s$ disconnects the normally provided processor clock C while permitting the monitoring clock $C_m$ to be applied therethrough to the clock inputs of the shift register storage devices of the string. Since the four shift register devices 15a-15d in FIG. 3 form a 16-bit string, it will be understood that a total of 16 monitoring clocks $C_m$ are required to feed the sixteen states of the four shift register devices 15a-15d to the monitoring unit 20 for monitoring diagnostic and/or corrective purposes and then back again so that the shift register devices are returned to their original states or to corrected states, after which normal operations may be resumed. It will be evident from FIG. 3 that the string comprises the 16 bits constituted by the shift register outputs $O_{1a}$, $O_{2a}$, $O_{3a}$, $O_{4a}$, $O_{1b}$, $O_{2b}$, $O_{3b}$, $O_{4b}$, $O_{1c}$, $O_{2c}$, $O_{3c}$, $O_{4c}$, $O_{1d}$, $O_{2d}$, $O_{3d}$, $O_{4d}$, wherein the a, b, c and d subscripts identify the respective one of shift registers 15a, 15b, 15c and 15d to which the outputs $O_1$, $O_2$, $O_3$ and $O_4$ correspond.

Figure 4:
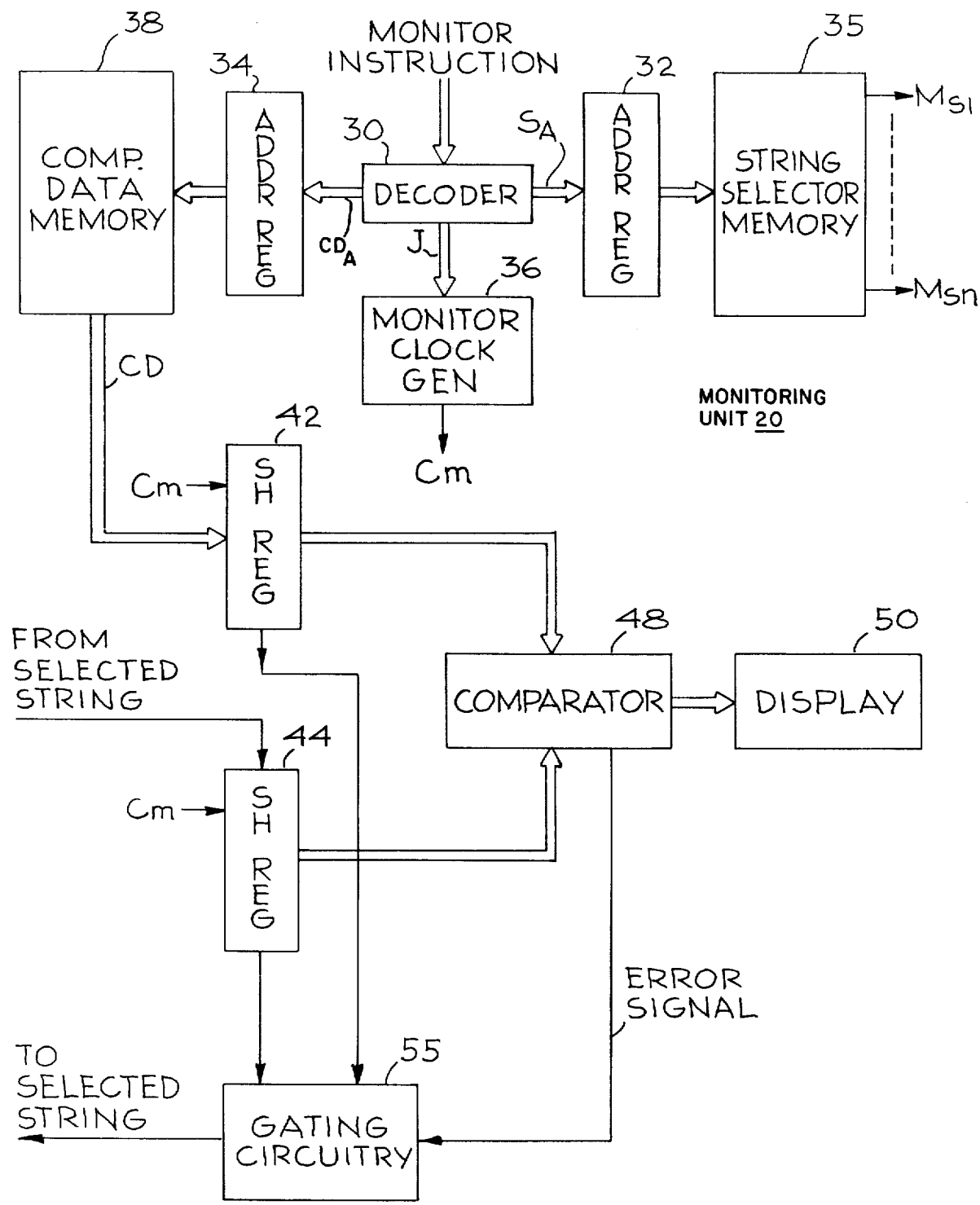
FIG. 4 is a block diagram illustrating an example of a monitoring unit which may be employed in accordance with the invention.

Reference is now directed to FIG. 4 which illustrates one type of monitoring unit 20 which may be employed. As indicated in FIG. 4, the operation of the monitoring unit 20 is initiated by a monitor instruction applied to a decoder 30 which derives therefrom a string address $S_A$ and a comparison data address $CD_A$ which are supplied to address registers 32 and 34, respectively.

The string address $S_A$ applied to address register 32 in FIG. 4 selects from a string selector memory 35 a particular one of monitor enable signals $M_{s1}-M_{sn}$ for enabling the gating circuitry $G_1$ and $G_2$ of a selected string for feeding the shift register states of the shift register storage devices making up the selected string to the monitoring unit 20 and back again as described previously in connection with FIG. 3.

The decoder 30 also applies a count signal J to a monitor clock generator 36 for producing a predetermined number of monitor clocks which is determined by the number of bits in the selected string.

Still with reference to FIG. 4, the comparison data address $C_{DA}$ applied to address register 34 selects from a comparison data memory 38 a particular comparison data word CD having values corresponding to the states of the shift register storage devices of the selected string, the selected comparison data word being applied to a shift register storage device 42 which may be of conventional form. Since the four 4-bit shift register storage devices provide a total of sixteen bits to be monitored, the corresponding comparison data word will likewise have sixteen bits and the shift register storage device 42 will accordingly be adapted to store at least sixteen bits. The bits of the selected string (provided as illustrated in FIG. 3) are serially loaded into a shift register storage device 44 which may also be of conventional form, and likewise is adapted to accommodate the sixteen bits fed thereto by the shift register storage devices of the selected string under the control of the monitor clock $C_m$.

The timing of the loading of the shift register devices 42 and 44 is chosen so that the sixteen bits of the selected string and the corresponding comparison data word are simultaneously stored in shift register storage devices 42 and 44, respectively, at which time they are then compared by a comparator 48 and the results of the comparison indicated by a display 50 or other appropriate device. Meanwhile, the sixteen bits from the selected string continue to be shifted under the control of monitor clock $C_m$ and after a total of 16 clocks are returned via gating circuitry 55 back to their respective shift register devices 15a-15 d in FIG. 3. In the event the comparator 48 detects an error between one or more bits of the selected string and the corresponding comparison data word, the comparator 48 provides an appropriate signal to gating circuitry 55 which causes the bits of the comparison data word (or any desired number of bits thereof) in shift register storage device 42 to be shifted to the shift register storage devices of the selected string instead of those in shift register storage device 44.

Figure 5:
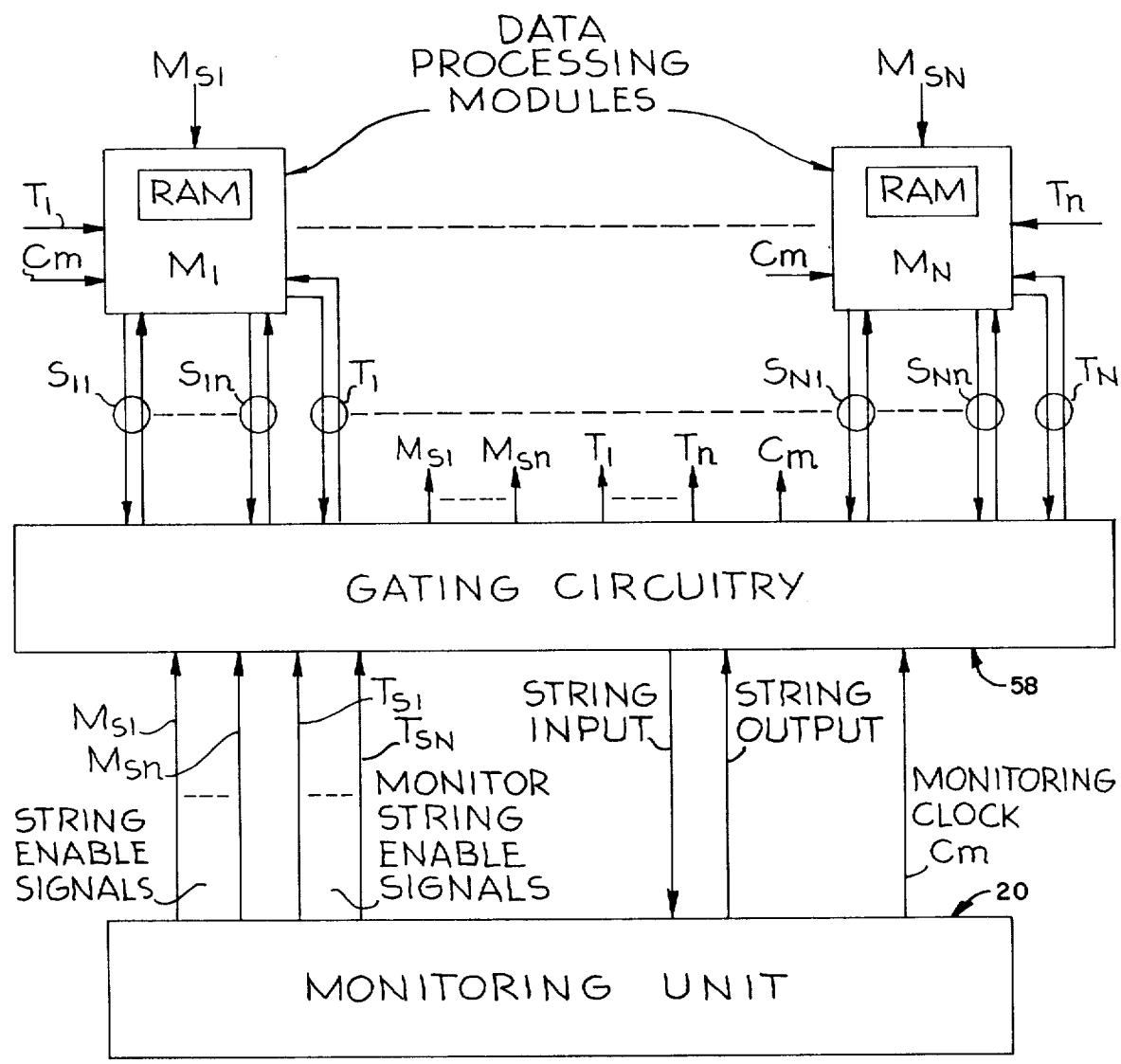
FIG. 5 is a block diagram illustrating how the present invention may advantageously be employed with a modular organized data processor.

Particular advantage may be made of the above described monitoring approach by organizing a data processor in the manner generally illustrated in FIG. 5. As indicated, a data processor may be implemented as a plurality of separately operating modules $M_1-M_N$, each including a RAM whose stored micro-code controls module operation. For the sake of simplicity, the various interconnections provided between the modules and between each module and its respective RAM for non-monitoring data processing purposes are not shown since they are not pertinent to the present invention. For the purposes of the present invention, it is sufficient to understand that, as illustrated in FIG. 5, each of modules $M_1$-$M_N$ is provided with a micro-code storing RAM and its own set of one or more strings of shift register storage devices of the type illustrated in FIGS. 2 and 3. Each such string is indicated in FIG. 5 by the capital letter "S" having a first subscript denoting the module number and a second subscript denoting the particular string of that module. For example, $S_{12}$ would designate the second string of module $M_1$. It will be understood that such an arrangement of strings as illustrated in FIG. 5 permits the storage devices in each module, via gating circuitry 58, to be separately and individually monitored, corrected and/or diagnosed.

It is additionally of advantage to provide one or more of the modules in FIG. 5 with at least one monitoring string, these being indicated in FIG. 5 by the capital letter "T" having a subscript denoting the corresponding module. These monitoring strings are provided in a manner so that the shift register storage devices of which each is comprised are not themselves involved in data processing operations, but rather are used for monitoring purposes within their respective modules. Accordingly, this permits each module to be individually monitored via a respective monitoring string while normal data processing operations are occurring.

Figure 6:
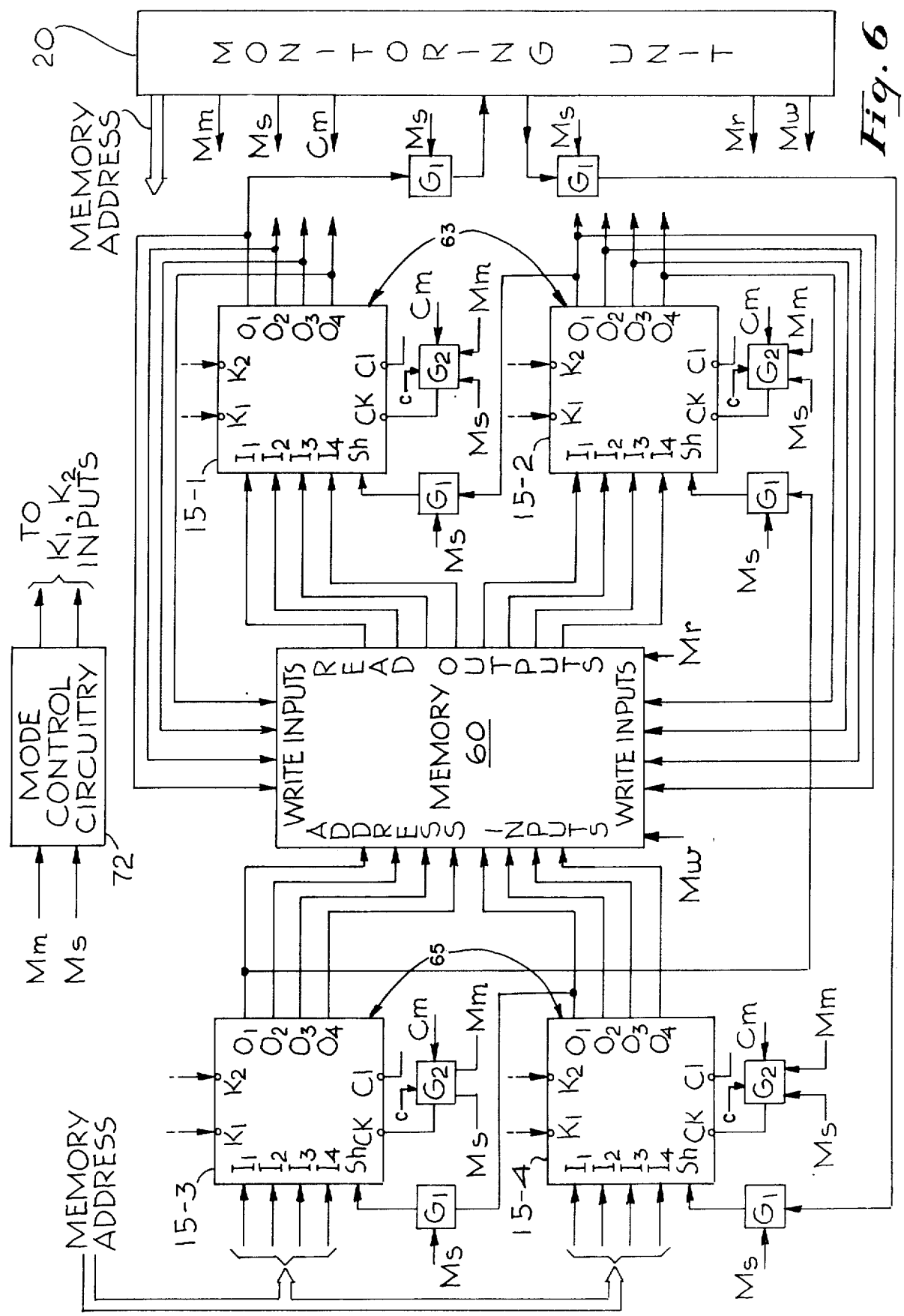
FIG. 6 is a block diagram illustrating how selectable storage states within a memory are made accessible for monitoring and/or micro-code loading or changing in accordance with the invention.

Next to be considered with reference to FIG. 6 is the manner in which selectable storage states within a memory (such as a RAM of a module in FIG. 5) are also made accessible for monitoring purposes. FIG. 6 illustrates, for example, a memory 60 having an input-output register 63 comprised of two variable mode shift register storage devices 15-1 and 15-2, each of which is preferably of the type illustrated in FIG. 2. As also shown in FIG. 6, a memory address register 65 is also provided using two such variable mode shift register storage devices 15-3 and 15-4 which it will be seen are connected with devices 15-1 and 15-2 to form a string in the same manner as illustrated in FIG. 3. It will be understood that the RAM of each of the modules illustrated in FIG. 5 is preferably arranged in the manner illustrated in FIG. 6.

An example of typical operation will now be presented with reference to FIG. 6 in order to illustrate how monitoring, loading and/or checking of selected memory states of a RAM within a selected module may typically be provided in accordance with the invention. The monitoring unit 20 first provides a memory monitoring control signal $M_m$ to the mode control circuitry 72 of a selected module which, in response thereto, provides $K_1K_2=11$ output signals indicative of a parallel loading mode. These $K_1K_2=11$ signals indicative of parallel loading are applied to the $K_1$ and $K_2$ inputs of the variable mode shift register storage devices 15-1 and 15-2 forming the RAM input-output register 63 in the selected module and are also applied to the variable mode shift register devices 15-3 and 15-4 forming the RAM address register 65 in the selected module. The monitoring unit 20 then provides a RAM address which is loaded in parallel into the RAM address register 65. This RAM address corresponds to the selected RAM states which it is desired be accessed. The monitoring unit 20 then provides a memory read signal $M_r$ which causes the memory 60 to read out the thus selected memory states which are loaded in parallel into the input-output register 62. If a monitoring or checking operation is to be provided, the monitoring unit 20 next selects the string in the selected module containing the variable mode shift register storage devices 15-1, 15-2, 15-3 and 15-4 and provides for shift mode operation thereof (that is, $K_1K_2=01$) in the same manner as previously described herein, whereby the selected RAM states which have been read into the input-output register 63 are fed to the monitoring unit and returned as also previously described herein. If a correction is to be provided by the monitoring unit, then, following the return of the respective bits to the variable mode shift register devices 15-1, 15-2, 15-3 and 15-4, the monitoring unit 20 provides a memory write signal $M_w$ which causes the corrected memory states returned to the memory input-output register 63 to be written into the memory 60 at the originally addressed location initially loaded into address register 65.

It will be understood with reference to the exemplary embodiment of the monitoring unit illustrated in FIG. 4 that the control signals $M_m$, $M_r$ and $M_w$ and the memory address provided by the monitoring unit for use in the illustrative embodiment of FIG. 6 may be obtained from the decoder 30 in FIG. 4 as a result of decoding a monitoring instruction which is specifically provided to include such signals in order to provide for the memory monitoring operation described. It will also be understood with reference to FIG. 4 that, in response to such a monitor instruction, the decoder 30 causes the monitor clock generator 36 to provide appropriate clock signals for use in loading the memory address register 65 and the input-output register 63 in FIG. 6 as well as providing clock pulses for shifting purposes as previously described.

If a loading operation of a selected location in the RAM is to be provided, operation is the same as described above in the case of a correction, except that the new states written into the RAM at the selected location constitute the new micro-code which it is desired be loaded at that RAM location. With reference to FIG. 4, it will be understood that, for this RAM loading operation, a loading instruction is provided to decoder 30 which causes address register 34 to read out from memory 38 into shift register 42 the desired new micro-code data which is to be loaded, rather than comparison data as in a monitoring or checking operation. It will also be understood that, for such a loading operation, the comparator 48 conveniently serves to cause return (via gating circuitry 55 and the selected string) of the new micro-code data (when different from the existing micro-code) to the RAM input-output register for writing into the selected RAM location.

Although the description herein has primarily been concerned with particular embodiments and examples of the invention, it is to be understood that the invention is subject to a wide variety of possible modifications and variations without departing from the true scope thereof. Accordingly, the present invention should be considered as encompassing all possible modifications, variations and alternative implementations coming within the broad scope of the invention as defined by the appended claims.

What is claimed is:

1. In a digital data processing system, the combination comprising:
    a plurality of selectively addressable RAMs containing instruction data for use in controlling data processing operations in said system;
    addressing means for said RAMs;

a RAM input-output register for each RAM comprised of a plurality of multi-bit storage devices;

each RAM being operative in response to a read signal to read out instruction data from a RAM location selected by said addressing means into its respective RAM input-output register;

each RAM also being operative in response to a write signal to write instruction data contained in its respective RAM input-output register into a RAM location selected by said addressing means;

controllable gating means for selectively reconfiguring the connections to the storage devices of each input-output register so as to form a selectable string; and monitoring and loading means;

said monitoring and loading means including means for selectively providing an address to said addressing means and a read signal or a write signal to a selected RAM;

said monitoring and loading means also including means for selectively generating one of a plurality of string selection signals which are applied to said gating means along with a predetermined plurality of clock signals which are applied to the storage devices of a selected string for causing the bits thereof to be propagated to said monitoring and loading means and then returned to their respective storage devices;

said monitoring and loading means further including means for monitoring the storage device bits applied thereto from a selected string and for selectively changing particular storage device bits applied thereto corresponding to different instruction data which it is desired to be written into a selected RAM;

said monitoring and loading means additionally including means for applying a write signal to a selected RAM after return of different instruction data to its respective RAM input-output register storage devices.

2. The invention in accordance with claim 1, wherein said system includes one or more additional storage devices which are included in particular strings formed by said gating means so that the corresponding bits thereof can also be monitored or changed when the corresponding string is selected.

3. The invention in accordance with claim 1, wherein said data processing system includes a plurality of data processing modules each containing one of said plurality of RAMs for controlling data processing operations in its respective module.

4. The invention in accordance with claim 1, 2 or 3, wherein said addressing means comprises an address register for each RAM comprised of a plurality of multi-bit storage devices, and wherein said gating means provides for connecting the storage devices of each address register in the same string as the storage devices of its respective RAM input-output register.

5. The invention in accordance with claim 1, 2 or 3, wherein each of said multi-bit storage devices is a variable mode shift register storage device having normal and shift operational modes, and wherein said controllable gating means is responsive to a signal from said monitoring and loading means to cause the plurality of variable mode shift devices in a selected string to be switched from a normal mode to a shift mode and to have the connections thereto reconfigured so as to form a serial string coupled to said monitoring and loading means and along which string the bits of the variable mode shift devices in the string are shifted in response to said clock signals.

6. The invention in accordance with claim 5, wherein each variable mode shift register storage device has a clock signal input, a plurality of inputs for receiving bits in parallel to be stored in the device, a corresponding plurality of outputs providing for the outputting in parallel of stored bits from the device, a shift input for receiving bits for serial shifting through the device in response to applied clock signals, and at least one mode control input for receiving mode control data from said controllable gating means for determining whether the variable mode shift device is to operate in a normal mode in which it serves to provide parallel input and output for said data processing system or is to operate in a shift mode in which bits applied to its shift input are serially shifted therethrough.

* * * * *

UNITED STATES PATENT AND TRADEMARK OFFICE
CERTIFICATE OF CORRECTION

PATENT NO. : 4,322,812

DATED : March 30, 1982

INVENTOR(S) : Sheila G. Davis et al.

It is certified that error appears in the above—identified patent and that said Letters Patent is hereby corrected as shown below:

On the title page, Item [75] should read:

[75] Inventors: Sheila G. Davis, Los Angeles; Robert E. Franks, San Gabriel, both of Calif.; Alfred J. DeSantis, Berwyn, Penn.

Signed and Sealed this

First Day of June 1982

[SEAL]

*Attest:*

*Attesting Officer*

GERALD J. MOSSINGHOFF

*Commissioner of Patents and Trademarks*

UNITED STATES PATENT AND TRADEMARK OFFICE
CERTIFICATE OF CORRECTION

PATENT NO. : 4,322,812
DATED : March 30, 1982
INVENTOR(S) : Sheila G. Davis et al.

It is certified that error appears in the above-identified patent and that said Letters Patent is hereby corrected as shown below:

The term of this patent subsequent to March 30, 1999, has been disclaimed.

Signed and Sealed this

Eighth Day of July 1986

[SEAL]

Attest:

Attesting Officer

DONALD J. QUIGG

Commissioner of Patents and Trademarks